(12) United States Patent
Dutt et al.

(10) Patent No.: US 7,404,161 B2
(45) Date of Patent: Jul. 22, 2008

(54) FULLCHIP FUNCTIONAL EQUIVALENCY AND PHYSICAL VERIFICATION

(75) Inventors: Arjun Dutt, Mountain View, CA (US); Stephan Hoerold, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 339 days.

(21) Appl. No.: 11/147,822

(22) Filed: Jun. 8, 2005

(65) Prior Publication Data

US 2006/0282810 A1  Dec. 14, 2006

(51) Int. Cl.
*G06F 17/50* (2006.01)
(52) U.S. Cl. .................. 716/5; 716/11; 716/12
(58) Field of Classification Search ............. 716/4–6, 716/11–12, 18
See application file for complete search history.

(56) References Cited

U.S. PATENT DOCUMENTS

| | | | |
|---|---|---|---|
| 5,623,608 A | 4/1997 | Ng | 395/250 |
| 5,958,027 A | 9/1999 | Gulick | 710/52 |
| 6,392,747 B1 | 5/2002 | Allen et al. | 356/141.1 |
| 6,550,045 B1 | 4/2003 | Lu et al. | 716/6 |
| 6,574,788 B1* | 6/2003 | Levine et al. | 716/18 |
| 7,055,118 B1* | 5/2006 | Kamepalli et al. | 716/5 |
| 2002/0129325 A1* | 9/2002 | Tanaka | 716/11 |
| 2005/0198601 A1* | 9/2005 | Kuang et al. | 716/6 |

* cited by examiner

*Primary Examiner*—Paul Dinh
(74) *Attorney, Agent, or Firm*—Dorsey & Whitney LLP

(57) ABSTRACT

A method for maintaining equivalency between the reference Register Transfer Logic (RTL) and the physical layout design of an integrated circuit by way of maintaining a reference netlist derived from symbolic connectivity.

20 Claims, 4 Drawing Sheets

FULLCHIP FUNCTIONAL EQUIVALENCY AND PHYSICAL VERIFICATION

BACKGROUND OF THE INVENTION

1. Field of the Invention

The present invention relates to semiconductor device manufacturing, and more particularly, maintaining equivalency between a logical design and a physical design of an integrated circuit.

2. Description of the Related Art

Integrated circuits (IC), such as application specific integrated circuits (ASIC), are typically designed using computer-aided design (CAD) tools using a hardware description language (HDL) that allow the designer to specify, in software, the logical operation of the chip. One such example of a hardware description language is Verilog.

Known design processes include several steps. First, a designer writes a software program describing the flow of signals in the chip and the logical operations performed on those signals. In Verilog, for example, such a program is written at the Register Transfer Level (RTL). Once the designer has programmed the operation of the logic circuit, the program is simulated and, if acceptable, synthesized into a corresponding collection of standard cells. Standard cells are components, such as logic gates, latches, decoders, and various other components, that exist in a library accessible by a synthesis tool. The synthesis step is typically an automated process in which the synthesis tool determines the appropriate standard cells and interconnections between standard cells to realize a circuit that satisfies the RTL model.

Conventional design flows derive a schematic from a reference RTL, then a layout from the schematic, to assist in maintaining functional and physical correctness. In an aggressive integration methodology, the modification of logic represented by the layout due to placement, route topologies, and clock loading constraints can create a mismatch between RTL and the layout. Hence, no reference schematic exists. To optimize performance, current integrated circuit design approaches allow the designer to specify the logic gate cell sizes for timing purposes, to cluster cells dynamically based on placement constraints, to balance clock loads, and to order scan chains. However, these approaches can create a vast difference between the RTL and corresponding layout, and create a need to back-annotate information into RTL. What is needed is a way to maintain equivalency between the physical layout and the reference RTL of the design.

SUMMARY OF THE INVENTION

In accordance with the present invention, a method is provided for maintaining symbolic connectivity in layout designs, which is initially derived from a known good register transfer level (RTL) design (i.e., a reference RTL). Symbolic connectivity is an embedded connectivity netlist, which maps to actual physical shapes in the layout design.

In one embodiment of the invention, a method provides consistent rules and specifications to back-end tools and flows to update the layout and symbolic connectivity in parallel. Each tool and flow can effectively modify the layout and the schematic derived from the reference RTL. When a reference schematic does not exist, the method provides a way to use existing design verification tools to check consistency between a layout, symbolic connectivity derived netlist, and a reference RTL. The method allows at various stages in the design process to determine physical equivalency between a layout and a symbolic connectivity derived netlist, and functional equivalency between a symbolic connectivity derived netlist and a reference RTL. One embodiment allows the designer to build a full-chip netlist, check equivalency at various design levels (CPU, block levels, etc.) and use the same netlist for full-chip or mixed-mode physical layout versus schematic verification.

In one embodiment, the invention relates to a method for maintaining symbolic connectivity in an integrated circuit design and updating symbolic connectivity of the physical layout design as changes occur to the physical layout design. Continuity can be maintained between physical layout, netlist, and RTL when physical changes occur by comparing the reference netlist with a known good RTL to assure it conforms to changes in the physical layout.

In one embodiment, the invention relates to a method for maintaining symbolic connectivity in an integrated circuit design which includes providing a reference Register Transfer Logic (RTL) design representation of the integrated circuit design, generating a netlist representation of the integrated circuit design, generating a physical layout of the integrated circuit design based upon the netlist representation of the integrated circuit design, and maintaining equivalency between the reference RTL design and a physical layout design of the integrated circuit design via the netlist representation of the integrated circuit design.

In another embodiment, the invention relates to an apparatus for maintaining symbolic connectivity in an integrated circuit design which includes means for providing a reference Register Transfer Logic (RTL) design representation of the integrated circuit design, means for generating a netlist representation of the integrated circuit design, means for generating a physical layout of the integrated circuit design based upon the netlist representation of the integrated circuit design, and means for maintaining equivalency between the reference RTL design and a physical layout design of the integrated circuit design via the netlist representation of the integrated circuit design.

The disclosure contains, by necessity, simplifications, generalizations and omissions of detail; consequently, those skilled in the art will appreciate that the disclosure is illustrative only and is not intended in any way to be limiting.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The present invention and its various embodiments provide an apparatus and method to achieve equivalency for all designs that use symbolic routing at the top level.

Figure 1:
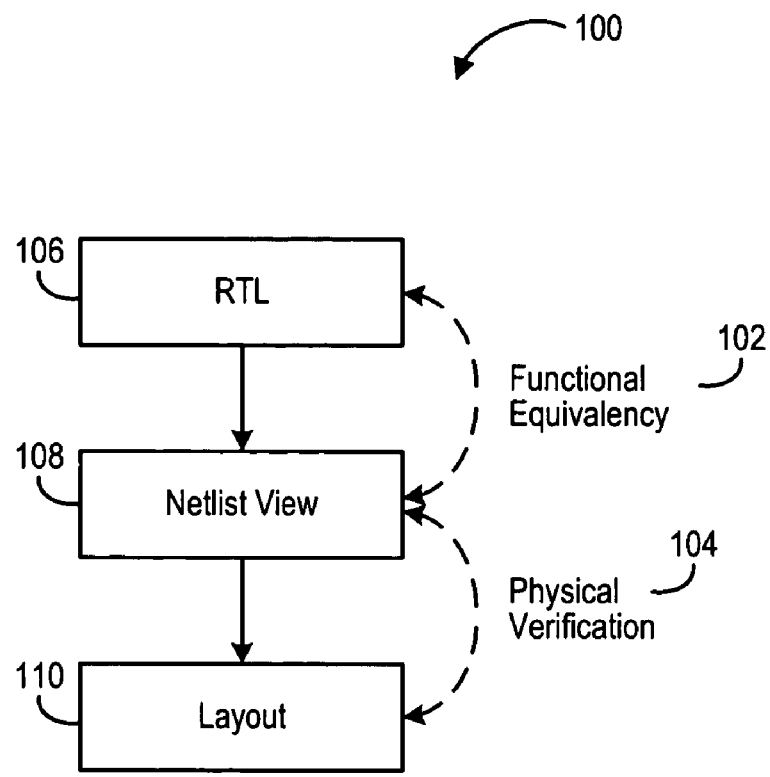
FIG. 1 shows a block diagram of an overview of the equivalency and physical verification method of the invention.

Referring to FIG. 1, a block diagram of an equivalency operation 100, used for broad level checks between register transfer level (RTL) 106 and a layout 110, is shown. In this embodiment, the method is performed in two steps. In step 102, functional equivalency is checked between RTL 106 and netlist view 108. In step 104 netlist view 108 and layout 110 are compared and physically verified using a layout versus schematic (LVS) procedure. In this embodiment of the invention, netlist view 108 is the common link and ensures consistency through the operations at steps 102 and 104.

Figure 2:
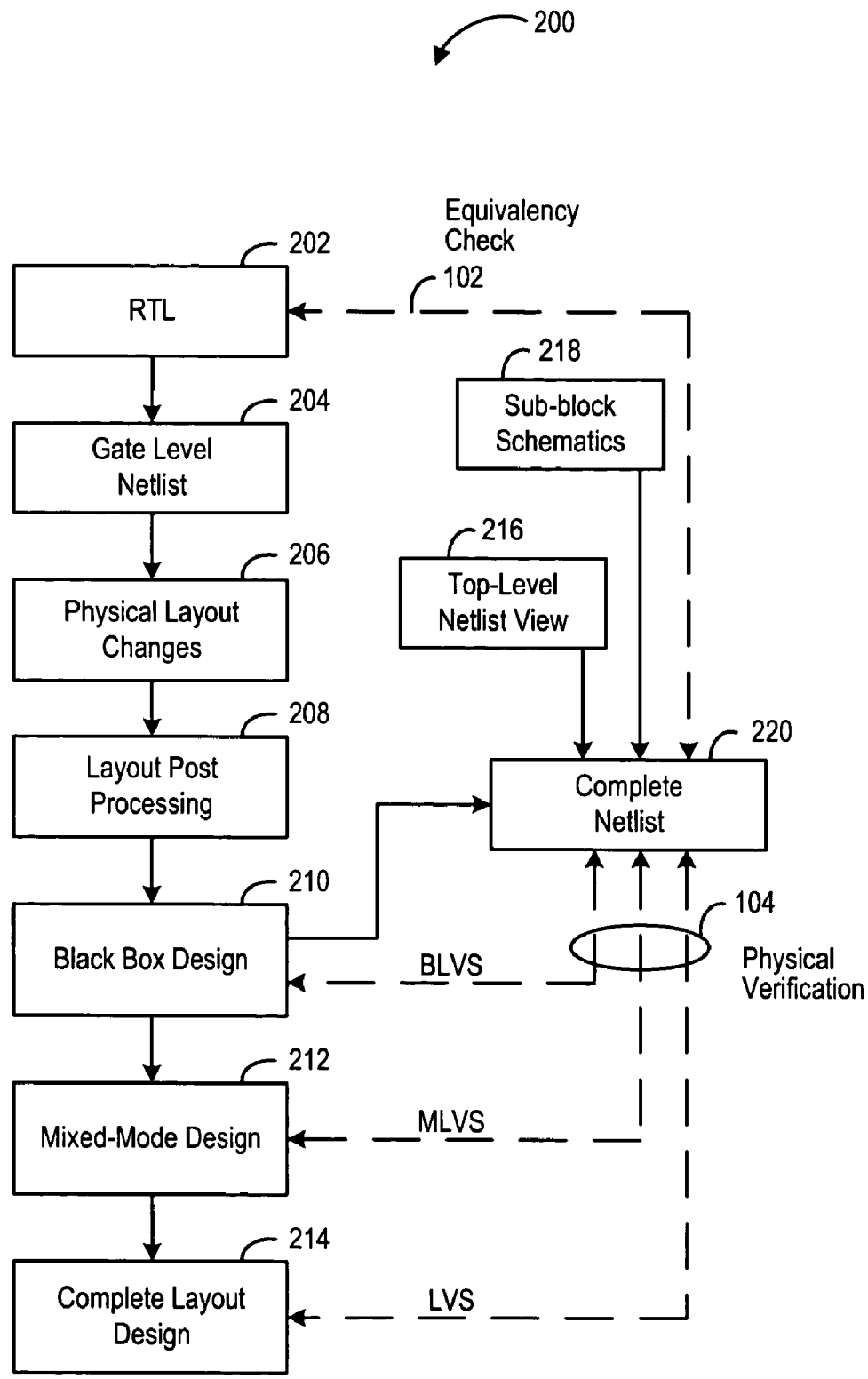
FIG. 2 shows a flowchart of one embodiment of the method of the invention to check equivalency when physical layout based changes are made to an integrated circuit design.

Referring to FIG. 2, an embodiment of the equivalency operation 100 is shown in a flowchart illustrating the operation of a system 200 for performing physical verification and functional equivalency checking. More specifically, at step 202 an RTL is synthesized. At step 204, a gate level netlist is generated based upon the synthesized RTL. At step 206, any physical layout based changes to the integrated circuit are included within the physical layout. In parallel, the symbolic connectivity is updated to reflect these physical layout based changes at which point functional equivalency can be used to ensure consistency.

Physical layout based changes may include for example, repeater insertion layout changes (the repeaters may be either inverters or buffers); latch or flop based repeater insertion layout changes (which affect the stage of a signal), clock header insertion layout changes, pipeline stage equalization layout changes and scan ordering layout changes. Engineering change order (ECO) based layout changes may also be considered a physical layout based change.

A clock header insertion layout change may occur when a clock is driving a load based upon where receiving blocks, that are being driven by the load, are located. It is desirable for the clock header to be placed physically proximate to the load. When performing the physical layout design, there are a limited number of consumers that a particular clock header can drive. The number of clock headers is not finally determined until the physical layout is designed.

A pipeline stage equalization layout change may occur because some signals within the integrated circuit design are global signals which may need to arrive at physically different locations of the integrated circuit at the same stage. Accordingly, the pipeline stage equalization layout change may insert stages to hold the global signal up to a certain cycle so that the signal reaches a particular location at a particular time.

A scan ordering layout change may occur based upon the placement of scannable elements. In scan chain routing the ordering of certain scan chain flops may not be known until the physical layout is designed. With scan chain routing, it is desirable for certain scan flops to be close to each other.

Physical layout changes can be based upon engineering change orders (ECOs) with or without changing the RTL. Physical verification can be performed immediately on the physical layout changes thus providing fast turn around on the engineering change order.

At step 208, layout post-processing (LPP) is performed that includes physical layout changes without altering symbolic connectivity. Thus physical verification can still be used to ensure consistency. At various points of the design process, different levels of detail can be introduced for the underlying blocks of the layout post-processed design. Block abstracts can be progressively replaced with corresponding block layouts as they become available. For example, at step 210, only abstract views are used to provide a black block design. At step 212, a combination of block abstracts and layout views are used to provide a mixed-mode design. At step 214, the block layouts are used to provide a complete layout design.

A top-level netlist view 216 is generated as an input to the complete block netlist 220. Additionally, sub-block schematic views are generated as inputs to the complete block netlist 220. At step 220, a complete block-level netlist is built from sub-block schematic information 218, and a top-level netlist view 216.

Physical to netlist verification 104 may be performed at one or more levels. More specifically, a block level layout-versus-schematic (BLVS) verification may be performed using the black box design generated at step 210. A mixed-mode LVS (MLVS) verification may be performed using the mixed-mode design generated at 212. A layout-versus-schematic verification may be performed using the complete layout design generated at step 214. The complete netlist 220 can then be compared to the RTL 202 to perform the equivalency check 102.

Figure 3:
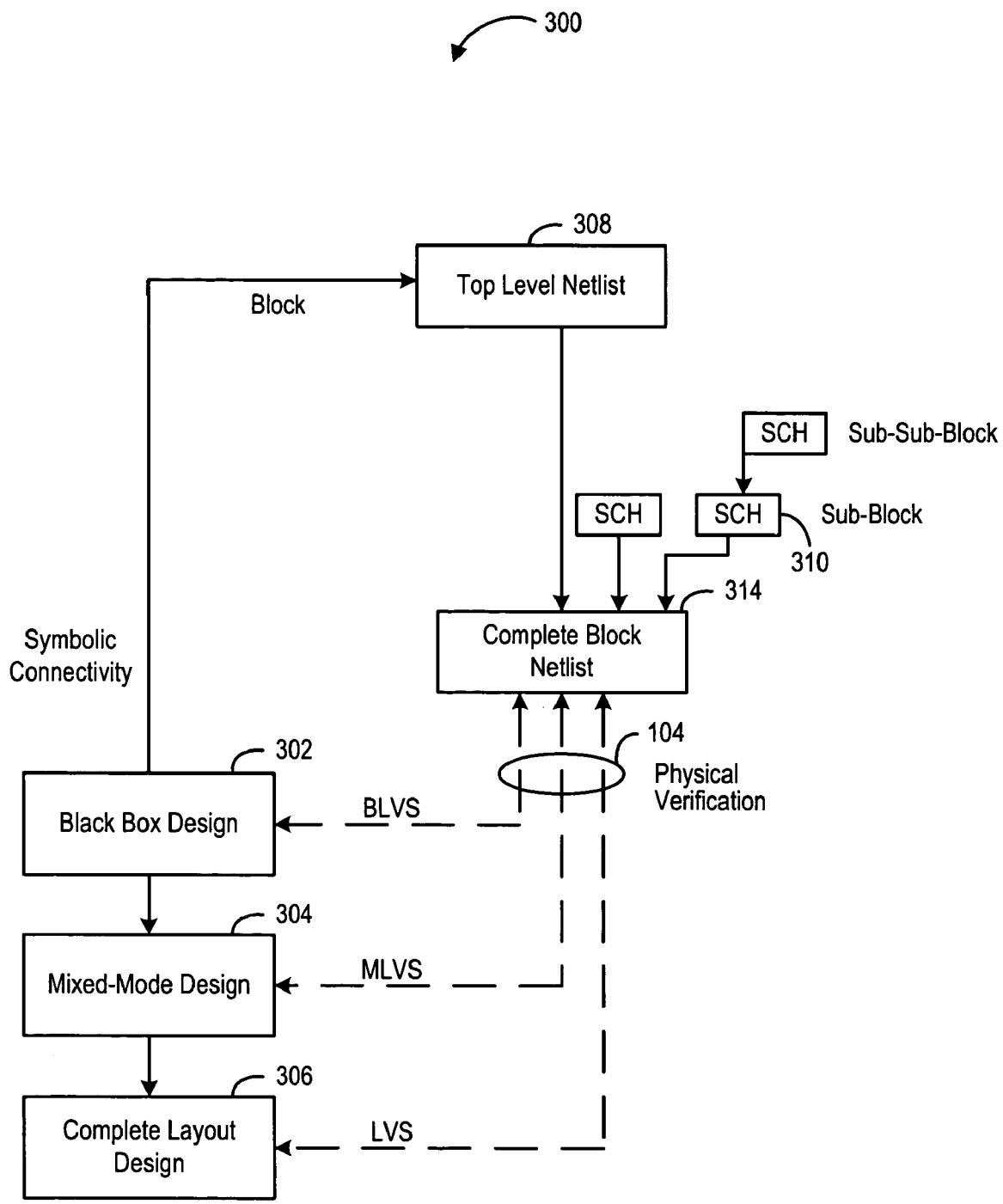
FIG. 3 shows a flowchart of one embodiment of the method of the invention illustrating the complete netlist build process for all sub-blocks.

Referring to FIG. 3, a flowchart of a complete netlist build process 300 for all sub-blocks is shown. At step 308, a top level netlist can be derived from the symbolic connectivity embedded within the design layout. This top level netlist encompasses the physical layout driven changes 206. At step 314, a complete netlist is built from a combination of the top level netlist and the underlying sub-block netlist representations such as sub-block schematics 310. The complete netlist is used to verify the design at various levels of abstraction 104. A black box design 302 is compared against the complete netlist using black box versus schematic verification (BLVS). A mixed mode design 304 is compared against the complete netlist using mixed box versus schematic verification (MLVS). A layout design 306 is compared against the complete netlist using a complete layout versus schematic verification (LVS).

Figure 4:
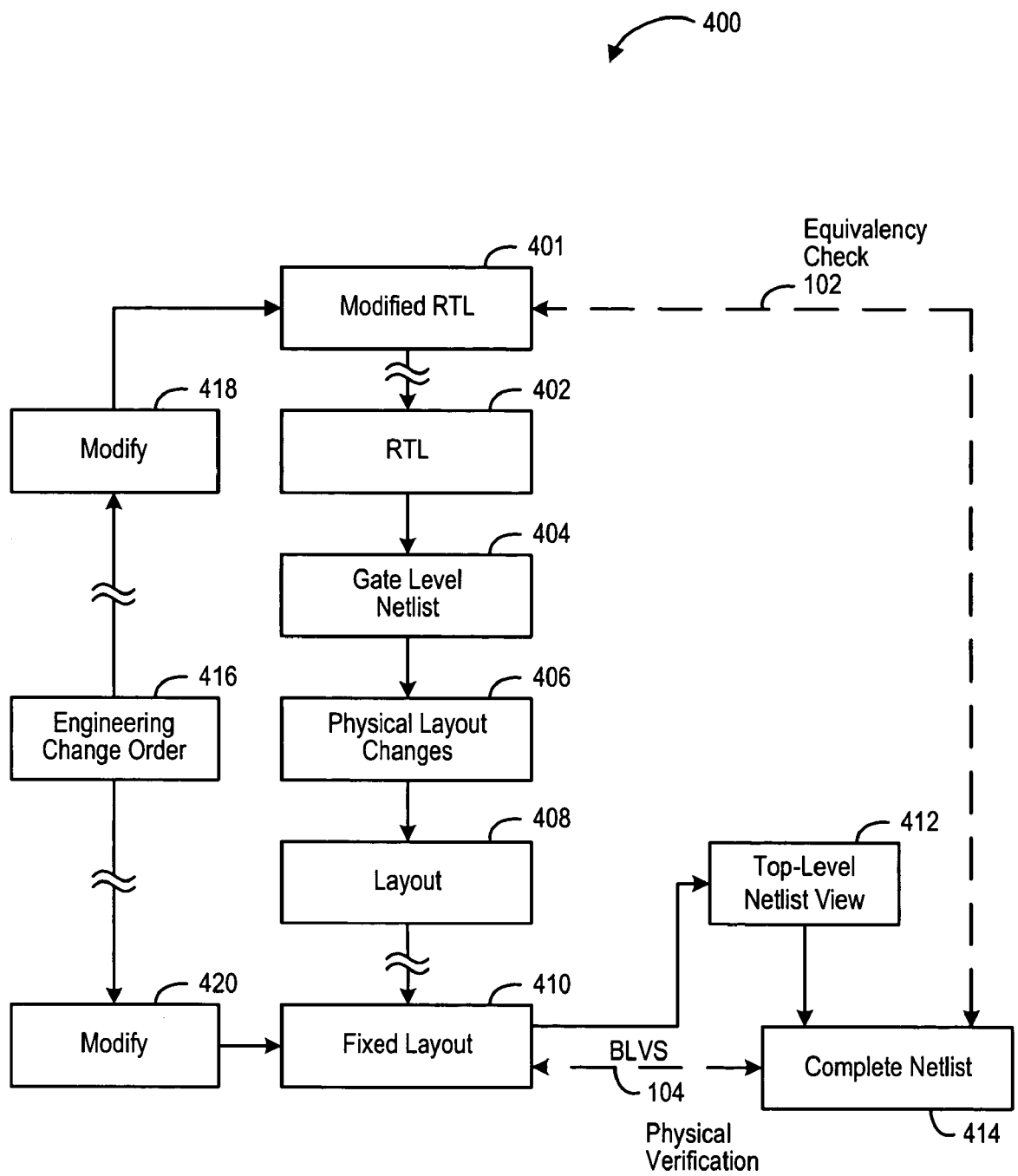
FIG. 4 shows a flowchart of one embodiment of the method of the invention, illustrating details of equivalency flow in the context of engineering change orders.

Referring to FIG. 4, a flowchart of the operation of a system 400 for performing physical verification and functional equivalency checking based upon engineering change orders is shown. Physical layout fixes may be implemented when it is no longer desirable to run automated flows.

At step 402, an RTL is synthesized. At step 404, a gate level netlist is generated based upon the synthesized RTL. At step 406, any physical layout driven changes to the integrated circuit and corresponding modifications to the symbolic connectivity are performed and are reflected within the layout at step 408.

An engineering change order 416 can be supported to modify RTL 401 or layout 410, while ensuring consistency of the changes. The engineering change order 416 is issued to modify an RTL at step 418. An engineering change order 416 can also be issued to modify layout at step 420. This will result in a modified RTL 401 or fixed layout 410.

Equivalency checks can be performed to ensure consistency between the modified RTL 401 and the fixed layout 410. A top level netlist 412 is derived from the fixed layout 410 with the updated symbolic connectivity and a complete netlist 414 is built. Design layout to complete netlist verification 104 may be performed. For example, a black box layout-versus-schematic (BLVS) verification 104 may be performed using the black box design 410 and the complete netlist 414. A functional equivalency check 102 is performed by comparing the complete netlist 414 against the modified RTL 401.

Thus, the RTL modifications and the physical layout modifications can be made separately while enabling verification of the engineering change orders that were incorporated into both the RTL and the physical layout. Additionally, the engineering change orders can be implemented with different degrees of granularity. Thus, for example, physical layout changes based upon ECO can be implemented for every ECO, while the RTL changes based upon ECO can be stored and implemented for a group of ECO.

OTHER EMBODIMENTS

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, use of the invention will provide a method for maintaining symbolic connectivity in top-level integrated circuit (IC) designs, which are initially derived from a reference RTL. Furthermore, when a reference schematic does not exist, the invention provides a way to use existing design verification tools to check physical equivalency and consistency between a layout, symbolic connectivity derived netlist, and a reference RTL at various stages of the design.

Also for example, the above-discussed embodiments include software modules that perform certain tasks. The software modules discussed herein may include script, batch, or other executable files. The software modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling sub-modules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A method for maintaining a reference netlist representation in a top level integrated circuit design comprising:
providing a reference Register Transfer Logic (RTL) design representation of the integrated circuit design;
generating the reference netlist representation of the integrated circuit design;
generating a physical layout design of the integrated circuit design based upon the reference netlist representation of the integrated circuit design;
updating the reference netlist representation of the integrated circuit design to reflect changes to the physical layout design;
verifying equivalency between the reference RTL design and the physical layout design of the integrated circuit design, wherein verifying equivalency further comprises:
comparing the physical layout design to the reference netlist representation;
comparing the reference RTL design to the reference netlist representation; and
maintaining equivalency between the reference RTL design and the physical layout design of the integrated circuit design using the reference netlist representation of the integrated circuit design, wherein maintaining equivalency includes updating the reference RTL design representation to reflect a subset of changes to the physical layout design using the reference netlist representation of the integrated circuit design.

2. The method of claim 1 further comprising:
mapping the reference netlist to a plurality of physical shapes in the physical layout design.

3. The method of claim 1 further comprising:
maintaining the reference netlist by using consistent rules and specifications to update a symbolic connectivity of the integrated circuit.

4. The method of claim 1 further comprising:
using the reference netlist to compare various details to the layout.

5. The method of claim 1 wherein:
the changes to the physical layout design include repeater insertion changes.

6. The method of claim 1 wherein:
the changes to the physical layout design include latch or flop based repeater insertion changes.

7. The method of claim 1 wherein:
the changes to the physical layout design include clock header insertion changes.

8. The method of claim 1 wherein:
the changes to the physical layout design include pipeline stage equalization changes.

9. The method of claim 1 wherein:
the changes to the physical design include scan order changes.

10. The method of claim 1 wherein:
the changes to the physical layout design include engineering change orders.

11. An apparatus for maintaining a reference netlist in a top level integrated circuit design comprising:
means for providing a reference Register Transfer Logic (RTL) design representation of the integrated circuit design;
means for generating the reference netlist representation of the integrated circuit design;
means for generating a physical layout design of the integrated circuit design based upon the reference netlist representation of the integrated circuit design;
means for updating the reference netlist representation of the integrated circuit design to reflect changes to the physical layout design;
means for verifying equivalency between the reference RTL design and the physical layout design of the integrated circuit design, wherein verifying equivalency further comprises:
means for comparing the physical layout design to the reference netlist representation;
means for comparing the reference RTL design to the reference netlist representation; and means for maintaining equivalency between the reference RTL design and the physical layout design of the integrated circuit design using the reference netlist representation of the integrated circuit design, wherein maintaining equivalency includes updating the reference RTL design representation to reflect a subset of changes to the physical layout design using the reference netlist representation of the integrated circuit design.

12. The apparatus of claim 11 further comprising:

mapping a reference netlist with a plurality of physical shapes in the physical layout design.

13. The apparatus of claim 12 further comprising:

means for maintaining the reference netlist by using consistent rules and specifications to update a symbolic connectivity of the integrated circuit.

14. The apparatus of claim 11 further comprising:

means for using the reference netlist to compare various details to the layout.

15. The apparatus of claim 11 wherein:

the changes to the physical layout design include repeater insertion changes.

16. The apparatus of claim 11 wherein:

the changes to the physical layout design include latch based repeater insertion changes.

17. The apparatus of claim 11 wherein:

the changes to the physical layout design include clock header insertion changes.

18. The apparatus of claim 11 wherein:

the changes to the physical design include pipeline stage equalization changes.

19. The apparatus of claim 11 wherein:

the changes to the physical layout design include scan order changes.

20. The apparatus of claim 11 further comprising:

the changes to the physical design include engineering change orders.

* * * * *